(12) United States Patent
Hasegawa

(10) Patent No.: US 7,069,195 B2
(45) Date of Patent: Jun. 27, 2006

(54) MAGNETIC FIELD GRADIENT COIL ASSEMBLY AND METHOD OF DESIGNING SAME

(75) Inventor: Kenichi Hasegawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 590 days.

(21) Appl. No.: 09/732,177

(22) Filed: Dec. 7, 2000

(65) Prior Publication Data

US 2003/0076100 A1    Apr. 24, 2003

(30) Foreign Application Priority Data

Dec. 7, 1999   (JP) .................................. 11-347375

(51) Int. Cl.
 *G06F 7/60* (2006.01)
 *G01R 33/20* (2006.01)
 *G01V 3/00* (2006.01)

(52) U.S. Cl. ............................ 703/2; 703/18; 324/216; 324/318

(58) Field of Classification Search ................ 703/2, 703/18; 324/320, 216, 318
See application file for complete search history.

(56) References Cited

U.S. PATENT DOCUMENTS

| | | | | |
|---|---|---|---|---|
| 4,978,920 A | * | 12/1990 | Mansfield et al. | 324/318 |
| 5,266,913 A | * | 11/1993 | Chapman | 335/216 |
| 5,296,810 A | * | 3/1994 | Morich | 324/318 |
| 5,349,297 A | * | 9/1994 | DeMeester et al. | 324/318 |
| 5,488,299 A | * | 1/1996 | Kondo et al. | 324/318 |
| 5,585,724 A | * | 12/1996 | Morich et al. | 324/318 |
| 5,770,943 A | * | 6/1998 | Zhou | 324/307 |
| 6,100,692 A | * | 8/2000 | Petropoulos et al. | 324/318 |
| 6,255,824 B1 | * | 7/2001 | Barbara | 324/321 |
| 6,456,076 B1 | * | 9/2002 | Joseph | 324/318 |

OTHER PUBLICATIONS

Schenck, J.F. et al. "Formulation of Design Rules for NMR Imaging Coil by Using Symbolic Manipulation." Proc. of the 4th ACM Symposium on Symbolic and Algebraic Computation. 1981. pp. 85-93.*

Ishibashi, K. "Nonlinear Eddy Current Analysis by the Integral Equation Method." IEEE Transactions on Magnetics. Sep. 1994 vol. 30, Issue 5. pp. 3020-3023.*

(Continued)

*Primary Examiner*—Paul L. Rodriguez
*Assistant Examiner*—Ayal Sharon
(74) *Attorney, Agent, or Firm*—The Webb Law Firm

(57) ABSTRACT

A method of designing a small-sized, self-shielding magnetic field gradient coil assembly that is for use in an NMR spectrometer, provides high approximation accuracy, is simple in structure, and has a large inside diameter. The gradient coil assembly consists of tightly wound inner and outer coils. The designing process starts with setting or resetting the number of the inner coils and the number of turns of each inner coil. Their positions are optimized such that the magnetic field gradient strength falls within a tolerable range under shielded condition. Then, the number of the outer coils and the number of turns of each outer coil are set. The Fourier components of a current distribution necessary for the outer coils are calculated.

12 Claims, 8 Drawing Sheets

OTHER PUBLICATIONS

Feliziani, M. "Characteristic Impedance Boundary Conditions for the Solution of Open Boundary Problems." IEEE Transactions on Magnetics. Mar. 1993. vol. 29, Issue 2. pp. 1816-1819.*

Hsiao, G.C. et al. "Mathematical Foundations for Error Estimation in Numerical Solutions of Integral Equations in Electromagnetics." IEEE Transactions on Antennas and Propagation. Mar. 1997. vol. 45, Issue 3, pp. 316-328.*

Ishibashi, K. "Eddy Current Analysis by the Boundary Integral Equation Method." IEEE Transactions on Magnetics. Mar. 1990 vol. 26, Issue 2, pp. 458-461.*

Misaki, T. et al. "Computation of 3-Dimensional Eddy Current Problems by Using Boundary Estimation Method." IEEE Transactions on Magnetics. Nov. 1985. vol. 21, Issue 6, pp. 2227-2230.*

Rucker, W.M. et al. "Three-Dimensional Magnetostatic Field Calculation Using Boundary Element Method." IEEE Transactions on Magnetics. Jan. 1988. vol. 24, Issue 1, pp. 23-26.*

Wright, S.M. et al. "Characterization of Coupling in Planar Array Coils wih Arbitrary Element Geometries." Proc. of the 16th Annual Int'l Conf. of the IEEE Engineering in Medicine and Biology Society, 1994. Nov. 1994. vol. 1, pp. 570-571.*

Weisstein, Eric. "Fourier Series". Eric Weisstein's World of Mathematics. ©1999, CRC Press, LLC. http://mathworld.wolfram.com/FourierSeries.html.*

Weisstein, Eric. "Green's Function". Eric Weisstein's World of Mathematics. ©1999, CRC Press, LLC. http://mathworld.wolfram.com/GreensFunction.html.*

Weisstein, Eric. "Integral Kernel". Eric Weisstein's World of Mathematics. ©1999, CRC Press, LLC. http://mathworld.wolfram.com/IntegralKernal.html.*

Weisstein, Eric. "Biot-Savart Law". Eric Weisstein's World of Physics. ©1999, CRC Press, LLC. http://scienceworld.wolfram.com/physics/Biot-SavertLaw.html.*

Weisstein, Eric. "Maxwell Equations". Eric Weisstein's World of Physics. ©1999, CRC Press, LLC. http://scienceworld.wolfram.com/physics/MaxwellEquations.html.*

Ramo, S. et al. "Fields and Waves in Communications Electonics". 2nd Edition. 1984. pp. 187-193.*

Parker, S. "McGraw-Hill Dictionary of Electrical and Electronic Engineering." 1984. p. 65.*

Laughton, M. "Electrical Engineer's Reference Book.". 14th Edition. 1985. pp. 14/1-14/11, and pp. 26/1 -26/4.*

Kiyoshi, T. et al. "Development of 1 GHz Superconducting NMR Magnet at TML/NRIM." IEEE Transactions on Applied Superconductivity. vol. 9, Issue 2. pp. 1051-8223. Meeting Date: Sep. 13, 1998-Sep. 18, 1998. Publication Date: Jun. 1999.*

Weisstein, Eric. "Green's Function", from MathWorld—A Wolfram Web Resource. ©1999 CRC Press. http://mathworld.wolfram.com/GreensFunction.html.*

Jin, Jian-Ming. "Electromagnetics in Magnetic Resonance Imaging." IEEE Antennas and Propagation Magazine. Dec. 1996. vol. 49, Issue 6, pp. 7-22.*

Siebold, H. "Design Optimization of Main, Gradient and RF Field Coils for MR Imaging." IEEE Transactions on Magnetics. Mar. 1990. vol. 26, Issue 2, pp. 841-846.*

Letter to the Editor. "A target field approach to optimal coil design", R. Turner, *J. Phys. D: Appl. Phys. 19* (1986), pp. L147-L151.

* cited by examiner

MAGNETIC FIELD GRADIENT COIL ASSEMBLY AND METHOD OF DESIGNING SAME

BACKGROUND OF THE INVENTION

1. Field of the Invention

The present invention relates to a method of designing a magnetic field gradient coil assembly used in a nuclear magnetic resonance (NMR) spectrometer or the like and to a magnetic field gradient coil assembly designed by such a method.

2. Description of the Related Art

NMR spectrometers have adopted self-shielding magnetic field gradient coils because quickly rising magnetic field gradient pulses are applied to specimens. The designing procedures used heretofore are now summarized by referring to FIGS. 1–4. The designing procedures use the target field method as described by R. Tuner in *A Target Field Approach to Optimal Coil Design, J. Phys. D: Appl. Phys.* 19, L147–L151 (1986) and by P. Mansfield and B. Chapman in *Multishield Active Magnetic Screening of Coil Structures in NMR, J. Magn. Reso.* 72, pp. 211–223 (1987). In the target field method, the distributions of electric currents flowing through virtual inside and outside coils are calculated. Furthermore, more coils are distributed computationally. In this way, current distributions are approximated.

FIG. 1 is a schematic diagram of an NMR detector in which a self-shielding magnetic field gradient coil is mounted. FIG. 2 is a schematic view illustrating a system of coordinates used for designing and calculations, as well as a coil bobbin. FIG. 3($a$) is a schematic view showing an inner coil. FIG. 3($b$) is a schematic view showing an outer coil. These inner and outer coils together form a Z-axis magnetic field gradient coil assembly. FIG. 4 is a flowchart illustrating calculational procedures. As shown in FIG. 1, the NMR detector is comprised of a cover 01, the aforementioned inner coil, indicated by numeral 02, the aforementioned outer coil, indicated by numeral 03, and an NMR detection coil 04. This detector has the coil bobbin in which cylinders 51, 52, 53, and 54 are formed, as shown in FIG. 2. These cylinders 51, 52, 53, and 54 are also referred to as cylinders 1–4, respectively, and have radii of $r_t$, $r_p$, $r_s$, and $r_b$, respectively. The radius $r_t$ of cylinder 1 is the radius of a target magnetic field that takes the form of the cylinder 51. The radius $r_p$ is the radius of the primary, inner coil, or the cylinder 52. The radius $r_s$ is the radius of the outer screen coil, or the cylinder 53. The radius $r_p$ is the radius of the boundary defined by the cylinder 54.

As an example, a Z-axis magnetic field gradient coil assembly is designed using the inner and outer coils in such a way that the magnetic field strength at the boundary having the radius $r_b$ is 0 (self-shielding) and that a target magnetic field strength is obtained at the radius $r_t$ at which a specimen is placed. A Green's function $G(k)$ used for magnetic field analysis is defined by Eqs. (1)–(6) below.

$$B(z)\Big|_{p, r=r_t} = \frac{\mu}{2\pi} \int_{-\infty}^{+\infty} e^{ikz} j(k)_p G(k)\Big|_{r_p \to r_t} dk \qquad \text{Eq. 1}$$

$$B(z)\Big|_{s, r=r_t} = \frac{\mu}{2\pi} \int_{-\infty}^{+\infty} e^{ikz} j(k)_s G(k)\Big|_{r_s \to r_t} dk \qquad \text{Eq. 2}$$

$$B(z)\Big|_{p, r=r_b} = \frac{\mu}{2\pi} \int_{-\infty}^{+\infty} e^{ikz} j(k)_p G(k)\Big|_{r_p \to r_b} dk \qquad \text{Eq. (3)}$$

$$B(z)\Big|_{s, r=r_b} = \frac{\mu}{2\pi} \int_{-\infty}^{+\infty} e^{ikz} j(k)_s G(k)\Big|_{r_s \to r_b} dk \qquad \text{Eq. (4)}$$

$$j(k)_p, j(k)_s : j(k)_s = \int_{-\infty}^{+\infty} e^{-ikz} J(z) dz \qquad \text{Eq. (5)}$$

$$G(k)\Big|_{r_p \to r_t}, G(k)\Big|_{r_s \to r_t}, G(k)\Big|_{r_p \to r_b}, G(k)\Big|_{r_s \to r_b} \qquad \text{Esq. (6)}$$

Eq. (1) indicates a magnetic field produced by the inner coil subassembly at the radius $r_t$. Eq. (2) indicates a magnetic field by the outer coil subassembly at the radius $r_t$. Eq. (3) indicates a magnetic field developed by the inner coil subassembly at the boundary radius $r_b$ obtained by calculation. Eq. (4) indicates a magnetic field set up by the outer coil subassembly at the boundary radius $r_b$ obtained by calculation. Eq. (5) defines Fourier components $j(k)_p$ and $j(k)_s$ of the current density distributions in the inner and outer coil subassemblies, respectively. Eq. (6) indicates a current-field Green's function (response function) in a Fourier space. In this equation, $r_p \to r_t$, $r_s \to r_t$, $r_p \to r_b$, and $r_s \to r_b$ meant the inner and outer coils produce magnetic fields at the radii $r_t$ and $r_b$, respectively.

The calculational procedures are next described by referring to the flowchart of FIG. 4. A target magnetic field distribution TARGET(z) is set. A target value of the magnetic field distribution generated by the coil assembly near the center axis of the cylinder of the detector is set (step S1). The Fourier components target(k) of the target magnetic field distribution TARGET(z) are calculated using Eq. (7) (step S2).

$$\text{target}(k) = \int_{-\infty}^{+\infty} e^{-ikz} \text{TARGET}(z) dz \qquad \text{Eq. (7)}$$

A current-field Green function (response function) adapted for the designed coil assembly is found. Using this Green's function and target(k), the Fourier components $j(k)_p$ and $j(k)_s$ of the distributions of the currents flowing through the virtual inner and outer self-shielding coils are calculated (step S3).

Where the sum of magnetic fields given by the Fourier components of the distributions of the currents flowing through the inner and outer coils at the boundary $r_b$ is null, shielding conditions are satisfied. Under this state, if the Fourier components $j(k)_p$ of the distribution of the current flowing through the inner coils is used, the Fourier components $j(k)_s$ of the distribution of the current flowing through the outer coils is given by Eq. (8).

$$j(k)_s = -j(k)_p \frac{G(k)\Big|_{r_p \to r_b}}{G(k)\Big|_{r_s \to r_b}} \qquad \text{Eq. (8)}$$

Accordingly, the Fourier components b(k) of the magnetic fields produced by the inner and outer coils are given by Eq. (9).

$$b(k)\big|_{r=r_t} = j(k)_p G(k)\big|_{r_p \to r_t} + j(k)_s G(k)\big|_{r_s \to r_t} = j(k)_p \left( G(k)\big|_{r_p \to r_t} - \frac{G(k)G(k)\big|_{r_s \to r_t r_p \to r_b}}{G(k)\big|_{r_s \to r_b}} \right) \quad \text{Eq. (9)}$$

Since b(k)=target(k), the Fourier components $j(k)_p$ and $j(k)_s$ of the distributions of the currents flowing through the virtual inner and outer coils are respectively given by:

$$j(k)_p = \frac{\text{target}(k)}{\left[ G(k)\big|_{r_p \to r_t} - \frac{G(k)G(k)\big|_{r_s \to r_t r_p \to r_b}}{G(k)\big|_{r_s \to r_b}} \right]} \quad \text{Eq. (10)}$$

$$j(k)_s = -j(k)_p \frac{G(k)\big|_{r_p \to r_b}}{G(k)\big|_{r_s \to r_b}} \quad \text{Eq. (11)}$$

By inverse-Fourier-transforming the Fourier components $j(k)_p$ and $j(k)_s$, the distributions $J(z)_p$ and $J(z)_s$ of the currents flowing through the virtual inner and outer coils are found (step S4). The distributions $J(z)_p$ and $J(z)_s$ of the is currents flowing through the virtual inner and outer coils are integrated, and the positions of the coils conforming to the calculated current distributions are determined (step S5).

With the above-described designing procedures, the currents flowing through the inner and outer coils are calculated simultaneously. Therefore, if the results of the calculations of the current distributions are ideal, and if the coils are large, then it is possible to wind the coils exactly. However, as the coils decrease in size, it becomes more difficult to fabricate the coils accurately, that is, it is necessary to wind conductive wire into a bobbin shape (i.e., distributed winding) according to the calculated coil geometry in order to obtain the current distributions found by calculations. Generally, many turns of wire are necessary to conform with the calculated coil geometry. Adjacent turns of wire come too close. Hence, it is difficult to wind the wire completely in accordance with the coil geometry. If lap winding is done, the coil diameter increases, thus varying the calculational conditions. If the number of turns of wire is few, the approximation error becomes large. This deteriorates the performance. To avoid this, the number of turns of wire must be increased, and the spacing between the adjacent turns of wire must be decreased. Thus, the target current distributions must be approximated with high accuracy. This is not a realistic solution.

In the case of a narrow-bore (NB) superconducting magnet (SCM), it is desired to set the inside diameter of the magnetic field gradient coils greater than 50% of the inside diameter of the probe cover. However, this cannot be achieved for the following reason. If the former inside diameter is set greater than 50%, the magnetic field leaking to the outside through the outer coil produces a large amount of eddy currents on the cover, thus reducing the rising speed. To avoid this, it is necessary to increase the number of turns of wire forming the coils and to distribute the turns of wire closely, for improving the accuracy of approximation. This will reduce the leakage of the magnetic field. However, this approach is difficult to accomplish because of coil resistance and restrictions on the mechanical dimensions. Furthermore, electric interference between a DC magnetic field gradient coil and the detection coil operating at hundreds of megaherz is large, lowering the Q of the detection coil. Consequently, the sensitivity drops. As a countermeasure, it is conceivable that an RF shield is formed inside the magnetic field gradient coil. However, this shield heavily interferes with the detection coil. This also lowers the Q.

SUMMARY OF THE INVENTION

It is an object of the present invention to provide a magnetic field gradient coil assembly that provides high approximation accuracy, is simple in structure, has a large inside diameter, permits small-sized self-shielding coils to be designed, and responds at a sufficient speed to be used in high-resolution NMR spectrometers. It is another object of the present invention to provide a method of designing this magnetic field gradient coil assembly.

A method of designing a magnetic field gradient coil assembly in accordance with the present invention uses tightly wound inner and outer coils to fabricate the gradient coil assembly. This method starts with setting or resetting the number of the inner coils and the number of turns of each inner coil and optimizing their positions such that a resulting magnetic field strength falls within a tolerable range of a target magnetic field gradient under shielded conditions. Then, the number of the outer coils and the number of turns of each outer coil are set. Thereafter, Fourier components of an electric current distribution necessary for the outer coils are calculated. The positions of the outer coils are optimized to approximate the Fourier components of the current distribution. Magnetic fields leaking from the inner and outer coils, respectively, are calculated. Magnetic field distortions caused by eddy currents produced by the leaking magnetic fields are calculated. Finally, the number of the outer coils and the number of turns of each outer coil are reset if the magnetic field distortions are outside the tolerable range.

In one feature of the present invention, the aforementioned step of setting or resetting the number of the inner coils and optimizing their positions such that a resulting magnetic field strength falls within a tolerable range of a target magnetic field gradient under shielded conditions uses a Green's function.

In another feature of the present invention, the aforementioned step of calculating Fourier components of an electric current distribution necessary for the outer coils uses a Green's function.

In a further feature of the present invention, the aforementioned step of optimizing the positions of the outer coils to approximate the Fourier components of the current distribution performs the approximation using a small number of tightly wound coils.

In a still further feature of the present invention, the aforementioned step of calculating magnetic fields leaking from the inner and outer coils, respectively, and the step of calculating magnetic field distortions caused by eddy currents produced by the leaking magnetic fields use a Green's function.

In a yet further feature of the present invention, the aforementioned step of resetting the number of the outer coils and the number of turns of each outer coil if the magnetic field distortions are outside the tolerable range, the step of calculating Fourier components of an electric current distribution necessary for the outer coils, the step of optimizing the positions of the outer coils to approximate the Fourier components of the current distribution by the outer coils, the step of calculating magnetic fields leaking from the inner and outer coils, respectively, and the step of calculating magnetic field distortions caused by eddy currents produced by the leaking magnetic fields are repeatedly carried out to determine optimum conditions for the outer coils by trial and error.

Furthermore, the present invention provides a magnetic field gradient coil assembly having tightly wound inner and outer coils, the magnetic field gradient coil assembly having been designed by a method starting with setting or resetting the number of the inner coils and the number of turns of each inner coil and optimizing their positions such that a resulting magnetic field strength falls within a tolerable range of a target magnetic field gradient under shielded conditions. Then, the number of the outer coils and the number of turns of each outer coil are set. Thereafter, Fourier components of an electric current distribution necessary for the outer coils are calculated. The positions of the outer coils are optimized to approximate the Fourier components of the current distribution. Magnetic fields leaking from the inner and outer coils, respectively, are calculated. Magnetic field distortions caused by eddy currents produced by the leaking magnetic fields are calculated. Finally, the number of the outer coils and the number of turns of each outer coil are reset if the magnetic field distortions are outside the tolerable range.

In one aspect of this method, the aforementioned step of setting or resetting the number of the inner coils and optimizing their positions such that a resulting magnetic field strength falls within a tolerable range of a target magnetic field gradient under shielded conditions uses a Green's function.

In another aspect of this method, the aforementioned step of calculating Fourier components of an electric current distribution necessary for the outer coils uses a Green's function.

In a further aspect of this method, the aforementioned step of optimizing the positions of the outer coils to approximate the Fourier components of the current distribution performs the approximation using a small number of tightly wound coils.

In a still other aspect of this method, the aforementioned step of calculating magnetic fields leaking from the inner and outer coils, respectively, and the step of calculating magnetic field distortions caused by eddy currents produced by the leaking magnetic fields use a Green's function.

In an additional aspect of this method, the aforementioned step of resetting the number of the outer coils and the number of turns of each outer coil if the magnetic field distortions are outside the tolerable range, the step of calculating Fourier components of an electric current distribution necessary for the outer coils, the step of optimizing the positions of the outer coils to approximate the Fourier components of the current distribution, the step of calculating magnetic fields leaking from the inner and outer coils, respectively, and the step of calculating magnetic field distortions caused by eddy currents produced by the leaking magnetic fields are repeatedly carried out to determine optimum conditions for the outer coils by trial and error.

Other objects and features of the present invention will appear in the course of the description thereof, which follows.

DESCRIPTION OF THE PREFERRED EMBODIMENTS

Figure 1:
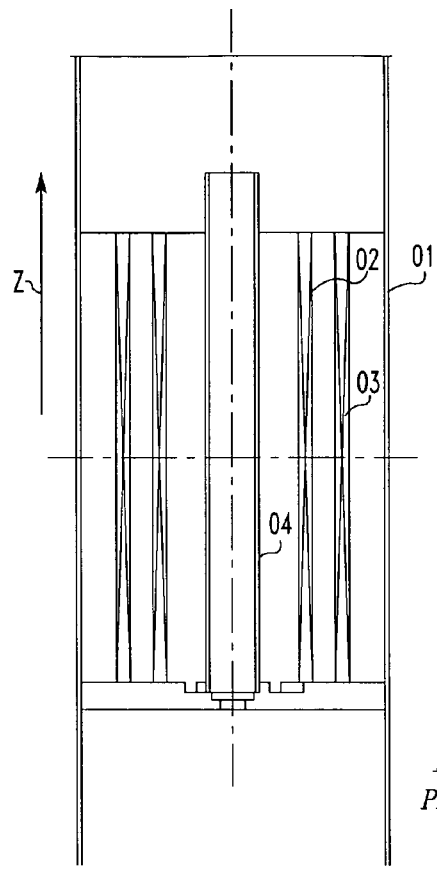
FIG. 1 is a conceptual view of a detector in which a self-shielding magnetic field coil assembly is mounted.
Figure 2:
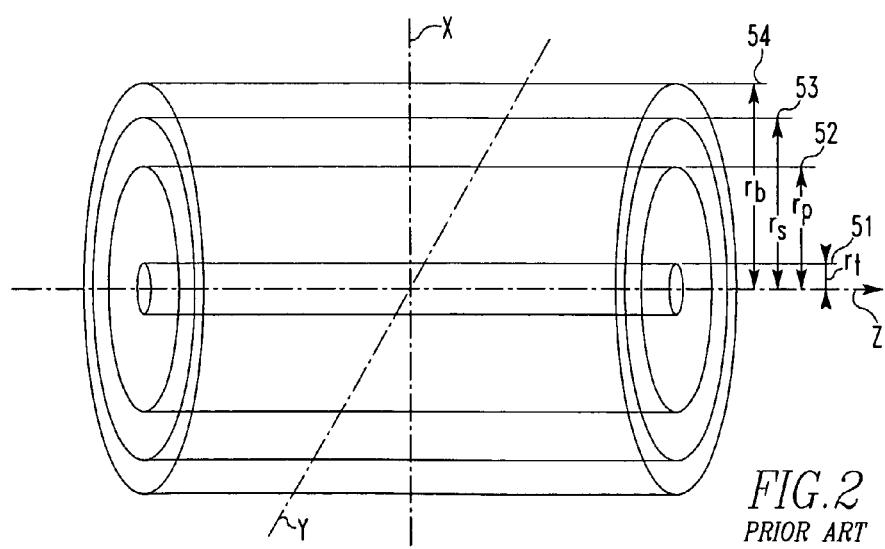
FIG. 2 is a side elevation of a coil bobbin, and in which a system of coordinates used for designing and calculations is also shown.
Figure 3A:
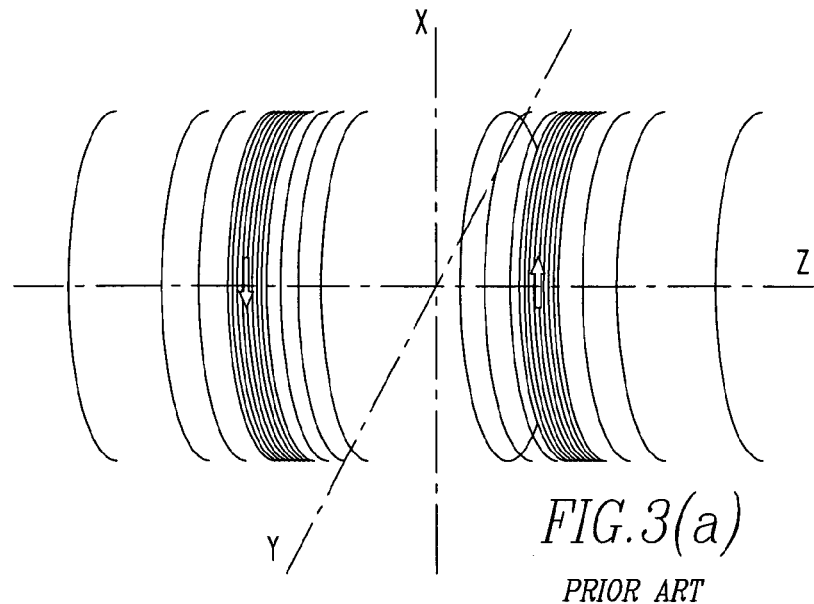
FIGS. 3(a) and 3(b) are schematic views of an inner coil and an outer coil.
Figure 3B:
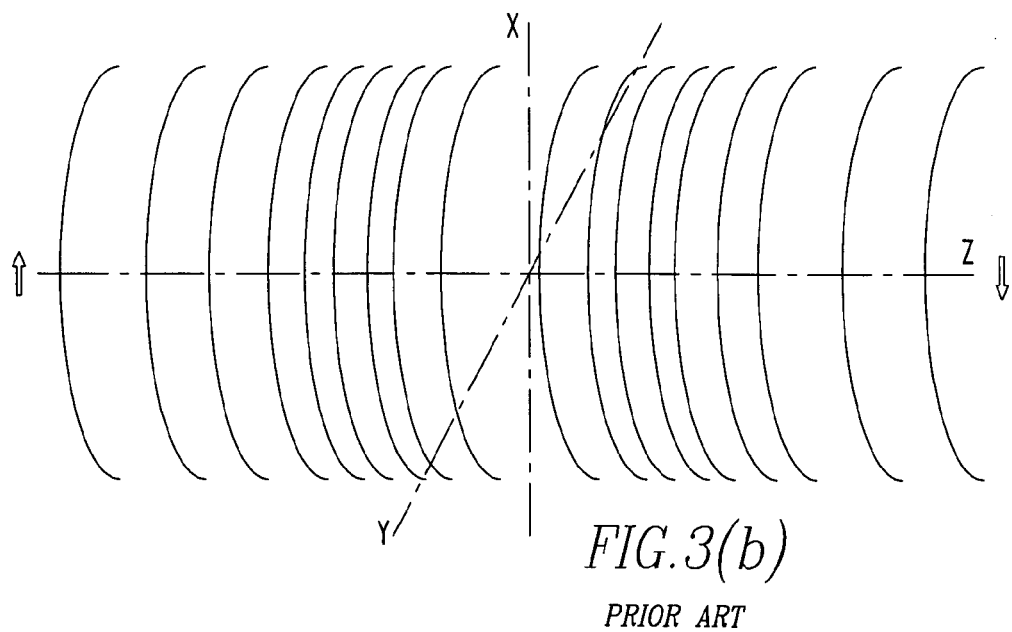
Figure 4:
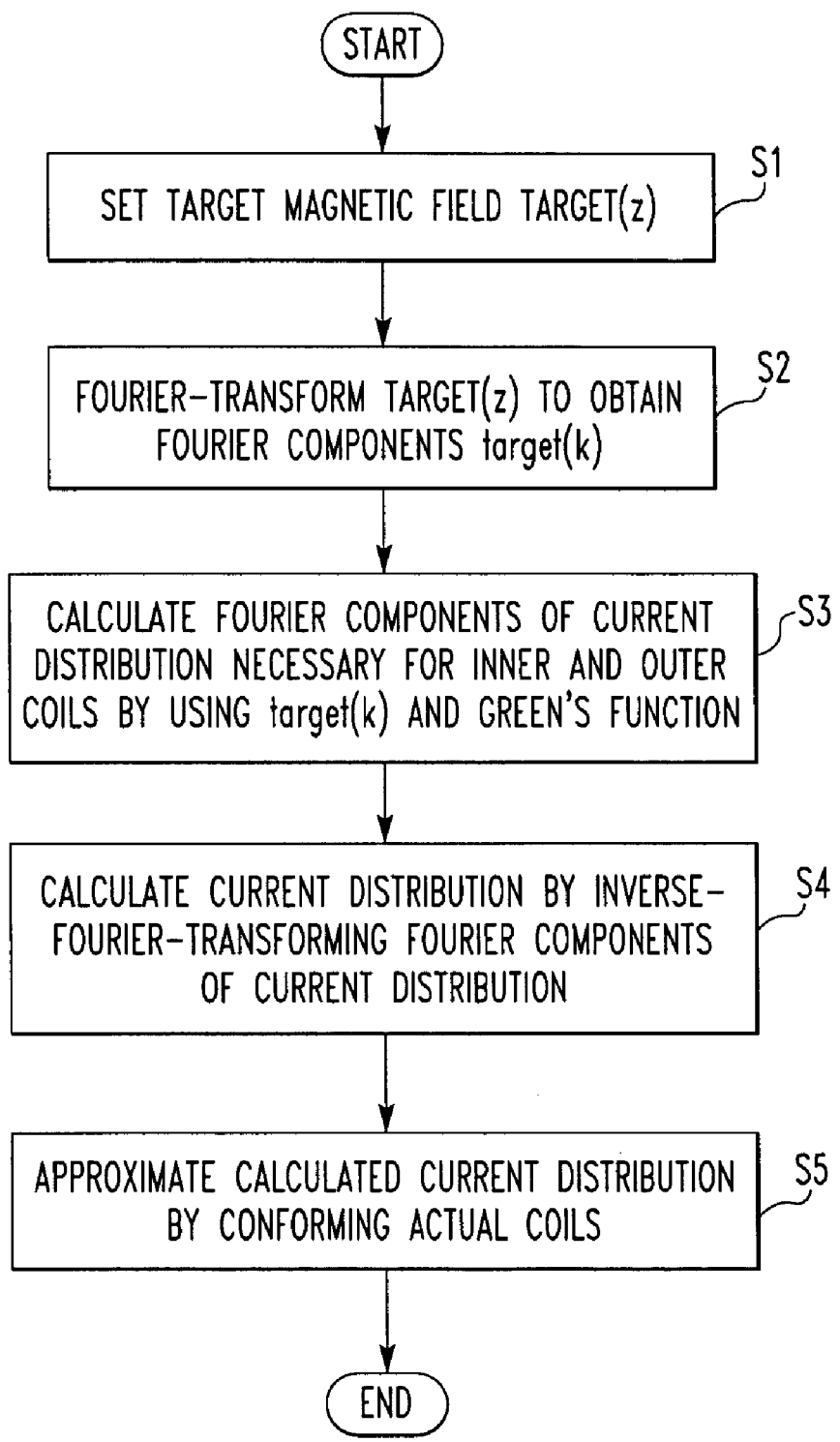
FIG. 4 is a flowchart illustrating calculational procedures used in the prior art method.

The preferred embodiments of the invention are hereinafter described. In the following description, the NMR detector of the structure described in connection with FIG. 1 and the system of coordinates and the coil bobbin used for designing and calculations already described in conjunction with FIG. 2 are also used. Accordingly, in the same way as in the prior art structure described previously, the detector of interest has a coil bobbin formed by cylinders 51, 52, 53, and 54, which are also referred to as cylinder 1, cylinder 2, cylinder 3, and cylinder 4, respectively. These cylinders 51, 52, 53, and 54 have radii of $r_t$, $r_p$, $r_s$, and $r_b$, respectively. The radius $r_t$ of cylinder 1 is the radius of a target magnetic field taking the form of the cylinder 51. The radius $r_p$ is the radius of the primary, inner coil, or the cylinder 52. The radius $r_s$ is the radius of the outer screen coil, or the cylinder 53. The radius $r_b$ is the radius of the boundary defined by the cylinder 54. An example of design of a Z-axis magnetic field gradient coil assembly is now taken. We assume that $r_t$=0, $r_p$=1.0, $r_s$=1.33, and $r_b$=1.5.

Figure 5A:
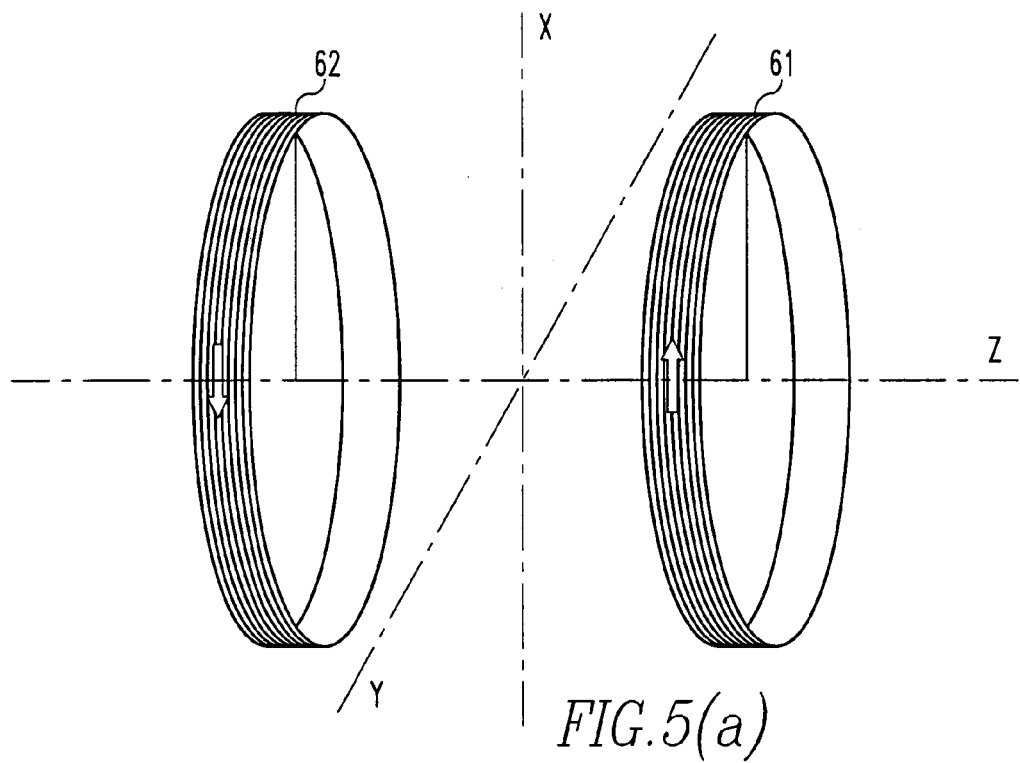
FIGS. 5(a) and 5(b) are views illustrating the structure of an inner coil subassembly in accordance with an embodiment of the present invention.
Figure 5B:
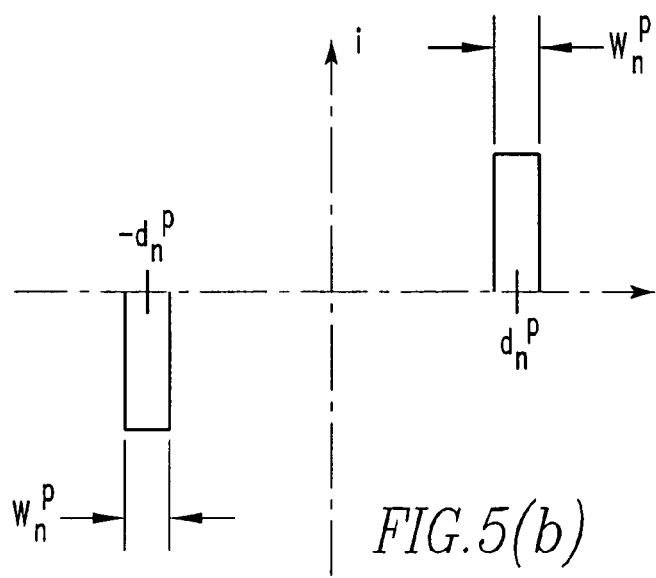
Figure 6A:
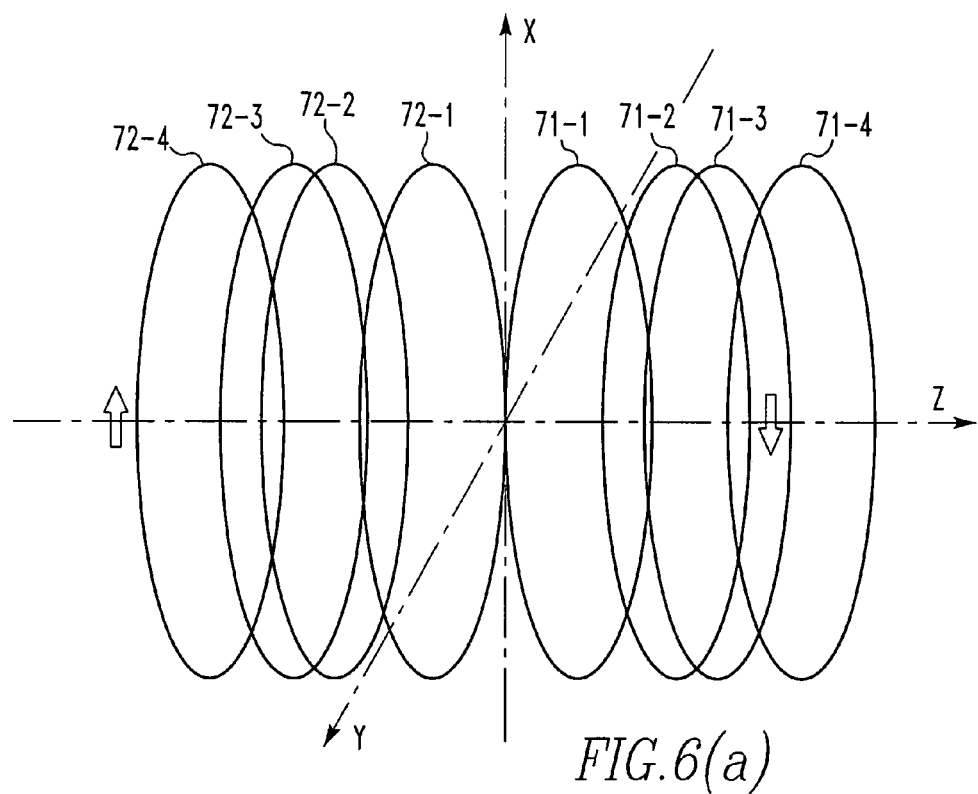
FIGS. 6(a) and 6(b) are views illustrating the structure of an outer coil subassembly in accordance with an embodiment of the present invention.
Figure 6B:
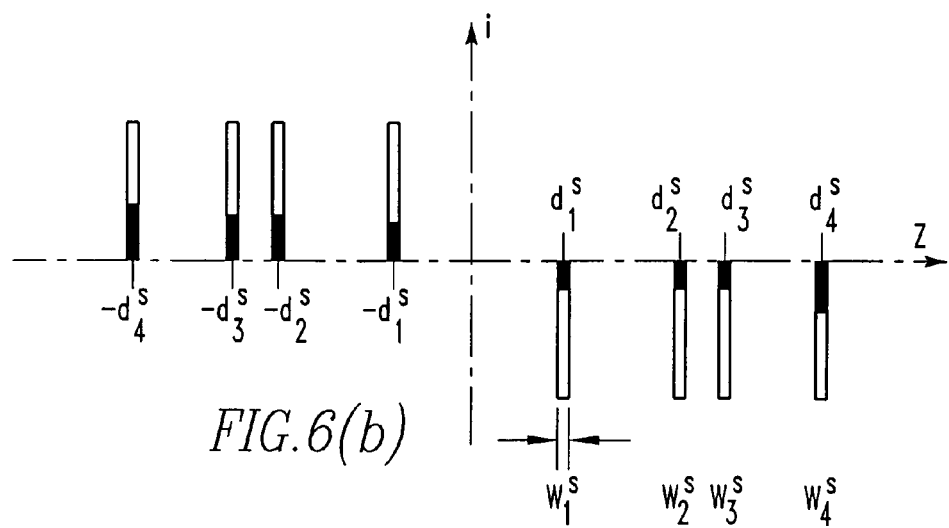

FIGS. 5(a) and 5(b) show the structure of an inner coil subassembly in accordance with the present invention. FIGS. 6(a) and 6(b) show the structure of an outer coil subassembly in accordance with the present invention. In the present invention, tightly wound coils having a given width are used. FIG. 5(a) shows the structure of the inner coil subassembly. FIG. 5(b) shows the distribution of surface current densities, and in which the clockwise direction as viewed from the +side of the Z-axis is indicated by +. FIG. 6(a) shows the structure of the outer coil subassembly. FIG. 6(b) shows the distribution of surface current densities.

Figure 7:
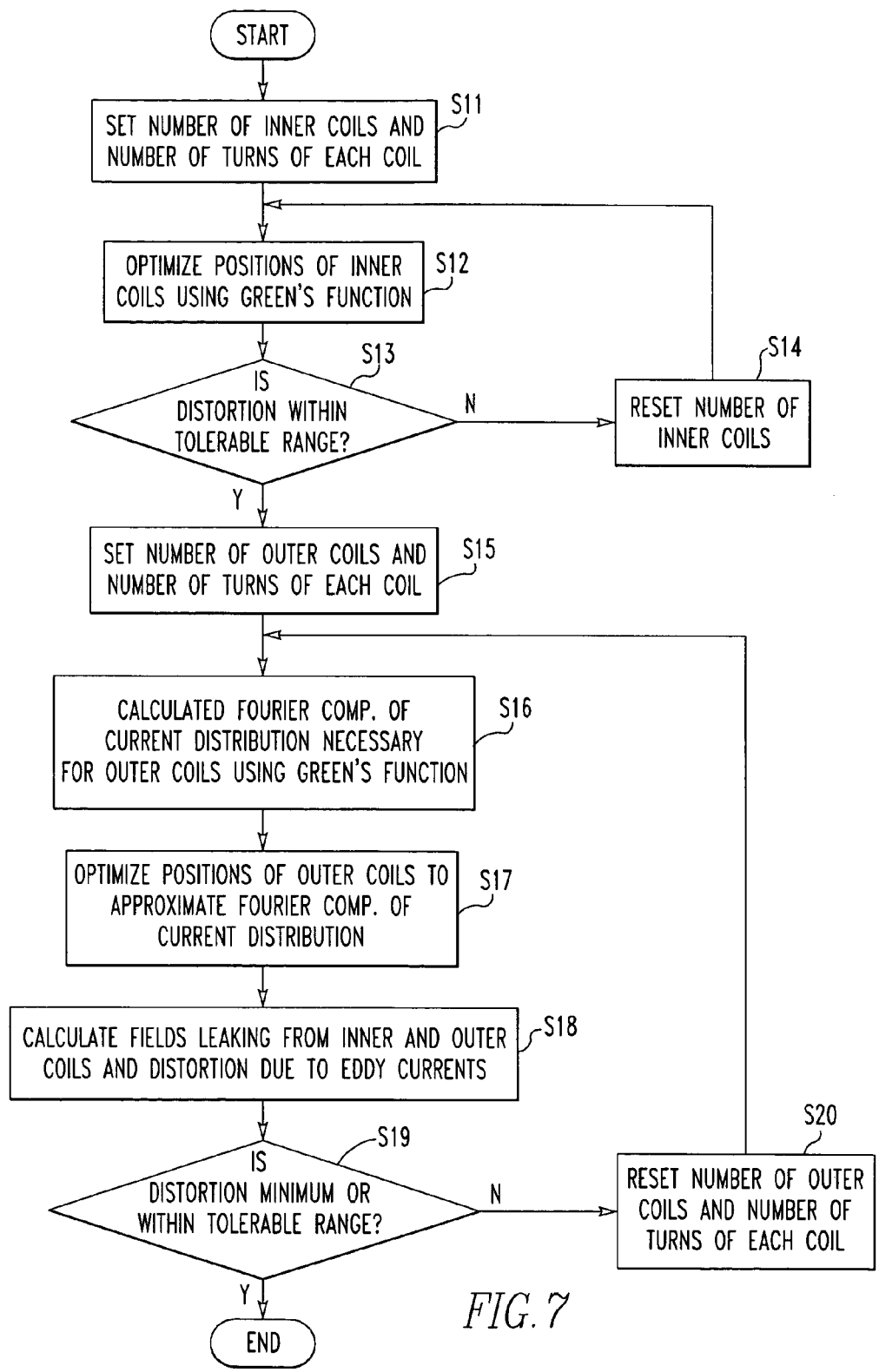
FIG. 7 is a flowchart illustrating calculational procedures used in the present invention.

The inner coil subassembly consists of wire coils 61 and 62. Each of the tightly wound coils spans a width of $w_n^p$. Their centers are located at $d_n^p$ (n=1). The outer coil subassembly consists of a first set of coils consisting of four tightly wound coils 71-1, 71-2, 71-3, and 71-4 and a second set of coils consisting of four tightly wound coils 72-1, 72-2, 72-3, and 72-4. Each of the tightly wound coils spans a width of $w_n^s$. The centers are located at $d_n^s$ (n=1, 2, 3, 4). FIG. 7 is a flowchart illustrating the calculational procedures in the present invention.

The Green's function G(k) for use in magnetic field analysis employs Eqs. (1)–(6) intact, the Eqs. (1)–(6) being used in the description of the prior art technique. Green's function values in this example of design are given in FIG. 8.

With respect to a Green's function for calculation of eddy currents, let $r_{b1}$ be the radius of the inner wall of the probe. Let $r_{b2}$ be the radius of a calculated boundary of eddy currents produced on its circumference. Also, it is assumed that $r_p < r_s < r_{b1} < r_{b2}$. The Green's function is defined as given by Eqs. (12)–(15):

$$B(z)\bigg|_{p,r=r_{b2}} = \frac{\mu}{2\pi} \int_{-\infty}^{+\infty} e^{ikz} j(k)_p G(k)\bigg|_{r_p \to r_{b2}} dk \quad \text{Eq. (12)}$$

$$B(z)\bigg|_{s,r=r_{b2}} = \frac{\mu}{2\pi} \int_{-\infty}^{+\infty} e^{ikz} j(k)_s G(k)\bigg|_{r_s \to r_{b2}} dk \quad \text{Eq. (13)}$$

$$B(z)\bigg|_{b1,r=r_{b2}} = \frac{\mu}{2\pi} \int_{-\infty}^{+\infty} e^{ikz} j(k)_{b1} G(k)\bigg|_{r_{b1} \to r_{b2}} dk \quad \text{Eq. (14)}$$

$$B(z)\bigg|_{b1,r=r_t} = \frac{\mu}{2\pi} \int_{-\infty}^{+\infty} e^{ikz} j(k)_{b1} G(k)\bigg|_{r_{b1} \to r_t} dk \quad \text{Eq. (15)}$$

where $j(k)_{b1}$ are the Fourier components of eddy currents produced on the inner wall of the probe. Eq. (12) indicates the magnetic field produced by the inner coil subassembly at the radius $r_{b2}$. Eq. (13) indicates the magnetic field produced by the outer coil subassembly at the radius $r_{b2}$. Eq. (14) indicates the magnetic field produced at the radius $r_{b2}$ by the eddy currents produced on the inner wall of the probe at the radius $r_{b1}$. Eq. (15) indicates the magnetic field produced at the radius $r_t$ by the eddy currents produced at the radius $r_{b1}$ on the inner wall of the probe. The calculational procedures are next described by referring to the flowchart of FIG. 7.

The number of the tightly wound coils forming the inner coil subassembly and the number of turns of each inner coil are determined, taking account of the actual fabrication. At this time, the width $w_n^p$ that each tightly wound coil spans is determined (step S11). Using a Green's function, the positions of the inner coils under the shielded condition are optimized, that is, distortion terms $z^3$, $z^5$, etc. are minimized. It is assumed that there is a perfect outer coil subassembly, thus completely shielding the inner coils (step S12).

The distribution in the current flowing through each inner coil is given by Eq. (16).

$$J(z)_p = \frac{I}{D^p} \sum_{n=1}^{N_p} \left[ \begin{array}{c} -H(z+d_n^p - W_n^p/2)(1 - H(z+d_n^p - W_n^p/2)) \\ +H(z-d_n^p + W_n^p/2)(1 - H(z-d_n^p - W_n^p/2)) \end{array} \right] \quad \text{Eq. (16)}$$

where $D^p$ is the diameter of the wire forming each inner coil, $j(z)_p$ is the current distribution function, $H(z)$ is a Heaviside function, and $N_p$ is the number of turns of each tightly wound coil. Because tightly wound coils are used, the current distribution takes the form of pulses and is represented as given above. Since there are two tightly wound coils arranged symmetrically about the center, the relation $N_p = 1$ holds. The center position $d_n^p$ (n=1) is a variable to be optimized.

Because the current distribution is given by an odd function with respect to the Z-axis (Eq. (17)), the Fourier functions of the current distribution are given by:

$$j(k)_p = \int_{-\infty}^{+\infty} e^{-ikz} J(z)_p dz = \quad \text{Eq. (17)}$$

$$\frac{I}{D^p} \sum_{n=1}^{N_p} \frac{2i}{k} \{-\cos(k(d_n^p - W_n^p/2)) + \cos(k(d_n^p + W_n^p/2))\}$$

Outside the outer coil subassembly, the magnetic field strength must be 0 at the calculated boundary $r_b$, i.e., the magnetic fields must cancel out completely. For this purpose, the distribution of the current flowing through the outer coils is given by:

$$B(z)\bigg|_{p,r=r_b} = - B(z)\bigg|_{s,r=r_b} \quad \text{Eq. (18)}$$

If this condition is expressed by current-density Fourier components, the Fourier components of the distribution of the density of the current flowing through the outer coils are given as follows, using a Green's 1 function and $j(k)_p$.

$$j(k)_s = -j(k)_p \frac{G(k)\big|_{r_p \to r_b}}{G(k)\big|_{r_s \to r_b}} \quad \text{Eq. (19)}$$

When the outer coil subassembly is shielding the magnetic field, the strengths of the magnetic fields produced by the inner and outer coil subassemblies in the center are respectively given by Eqs. (20) and (21).

$$B(z)\bigg|_{p,r=r_t} = \frac{\mu}{2\pi} \int_{-\infty}^{+\infty} e^{ikz} j(k)_p \overset{\text{screen}}{G(k)}\bigg|_{r_p \to r_t} dk \quad \text{Eq. 20}$$

$$\overset{\text{screen}}{G(k)}\bigg|_{r_p \to r_t} = G(k)\bigg|_{r_p \to r_t} - \frac{G(k)\big|_{r_p \to r_b} G(k)\big|_{r_s \to r_t}}{G(k)\big|_{r_s \to r_b}} \quad \text{Eq. (21)}$$

Using the Green's function of Eq. (21), the strength of the magnetic field produced by the inner coil subassembly at the target position $r_t$ can be expanded with respect to Z as given by Eq. (22)

$$B(z)\bigg|_{r=r_t} = \frac{\mu}{2\pi} \int_{-\infty}^{+\infty} e^{ikz} j(k)_p \overset{\text{screen}}{G(k)}\bigg|_{r_p \to r_t} dk = \quad \text{Eq. 22}$$

$$\frac{\mu}{2\pi} \int_0^{+\infty} \left\{ 1 + (ikz) + \frac{1}{2!}(ikz)^2 + \frac{1}{3!}(ikz)^3 + \ldots \right\}$$

$$\left[ \frac{I}{D^p} \sum_{n=1}^{N_p} \frac{2i}{k} \{-\cos(k(d_n^p - w_n^p/2)) + \cos(k(d_n^p + w_n^p/2))\} \right]$$

-continued $$\underset{r_p \to r_t}{\overset{screen}{G(k)dk}} = \frac{I}{D^p} \frac{2\mu}{\pi} \int_0^{+\infty} \left\{ z - \frac{1}{3!}k^2 z^3 + \frac{1}{5!}k^4 z^5 \ldots \right\}$$

$$\left[ \sum_{n=1}^{Np} \{\cos(k(d_n^p - w_n^p/2)) - \cos(k(d_n^p + w_n^p/2))\} \right]$$

$$\underset{r_p \to r_t}{\overset{screen}{G(k)dk}} = I \frac{2\mu}{\pi} \{Q_1(d, w) \cdot z +$$

$$Q_3(d, w) \cdot z^3 + Q_5(d, w) \cdot z^5 \ldots \}$$

Since the current distribution is an odd function, there are no even terms. The first-order term (magnetic field gradient strength) $Q_1$ and the third-order term (distortion) $Q_3$ of the magnetic field components produced by the coil subassembly are given by Eqs. (23) and (24), respectively. Here, $d_n^p$ that minimizes the magnetic field strength $Q_3$ is found.

$$Q_1(d_n^p, w_n^p) = \frac{2\mu}{\pi} \qquad \text{Eq. (23)}$$

$$\sum_{n=1}^{Np} \int_0^{+\infty} \{\cos(k(d_n^p - w_n^p/2)) - \cos(k(d_n^p + w_n^p/2))\} \underset{r_p \to r_t}{\overset{screen}{G(k)dk}}$$

$$Q_3(d_n^p, w_n^p) = -\frac{2\mu}{3!\pi} \sum_{n=1}^{Np} \int_0^{+\infty} k^2 \qquad (24)$$

$$\{\cos(k(d_n^p - w_n^p/2)) - \cos(k(d_n^p + w_n^p/2))\} \underset{r_p \to r_t}{\overset{screen}{G(k)dk}}$$

The optimum values in the example of design are $d_1^p=0.89$ and $w_1^p=0.63$.

If the magnetic field distortion is not within the tolerable range, the structure of the inner coil subassembly is reset. Then, the designer returns to the step S12, where the sequence of operations is repeated (steps S13 and S14). If the magnetic field distortion is within the tolerable range, the number of tightly wound coils forming the outer coil subassembly and the number of turns of each coil are set (step S15). Thus, the value of the width $w_n^p$ that each tightly wound coil spans is determined (step S16).

Since the Fourier components of the current distribution that the outer coil subassembly must achieve satisfy the condition that the magnetic field strength at the calculated boundary $r_b$ is 0, the Fourier components are given by:

$$j(k)_s = -j(k) \frac{\underset{r_p \to r_b}{G(k)}}{\underset{r_s \to r_b}{G(k)}} \qquad \text{Eq. (25)}$$

The Fourier components $j(k)_s$ of the current distribution are approximated by optimizing the positions of the coils of the outer coil subassembly (step S17). With the prior art designing method, the Fourier components $j(k)_s$ are inverse-Fourier-transformed to find the current distribution, and many turns of conductive wire are distributed for approximation. In the present invention, the current density distribution Fourier components $j(k)_s$ that the outer coil subassembly must achieve are approximated by a small number of tightly wound outer coils preset in step S15, as described below.

Figure 8:
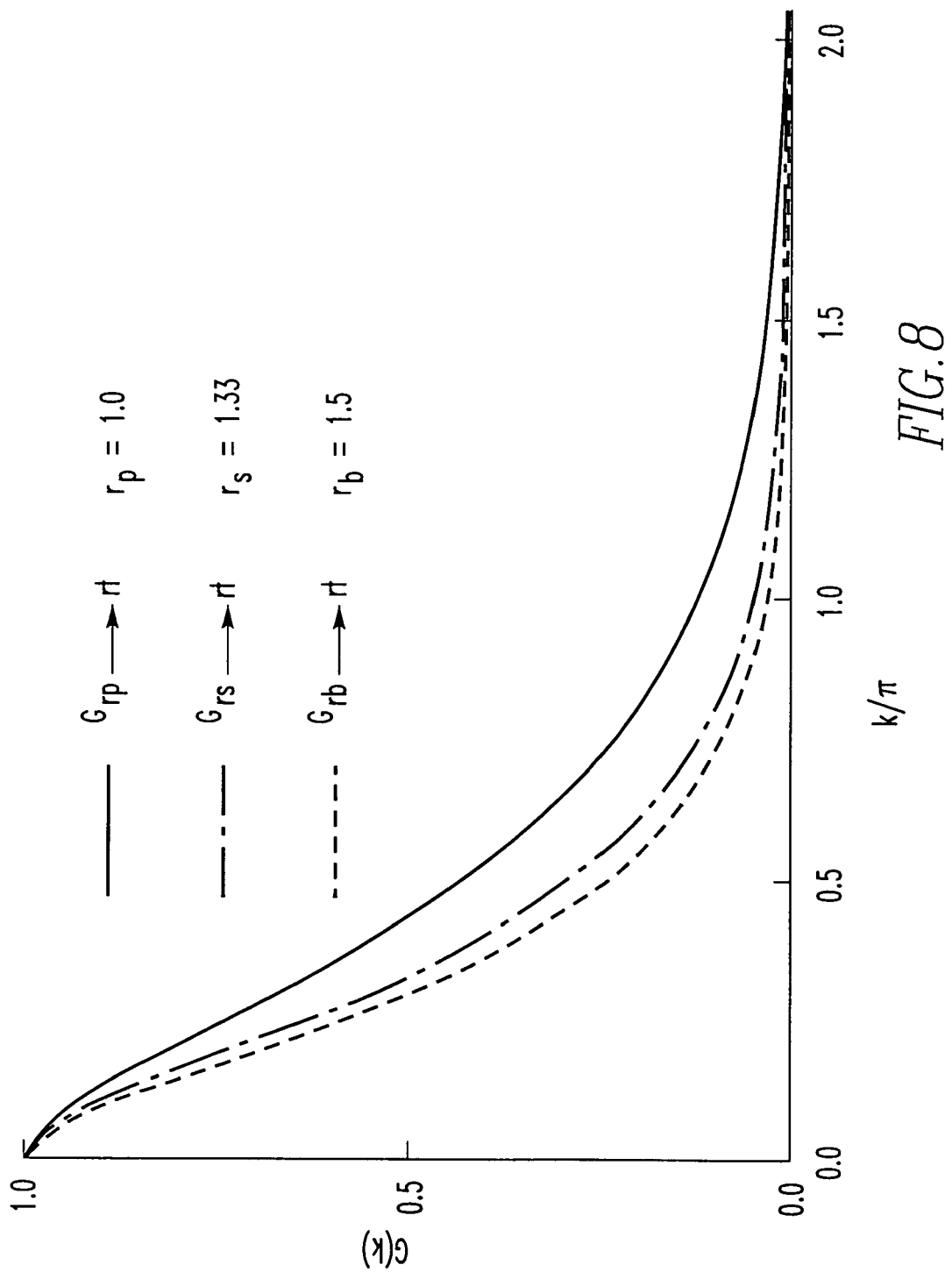
FIG. 8 is a graph showing Green's function values in an example of design.

As shown in FIG. 8, the response function exponentially decays in a region where k is large. Therefore, in this example of designing in accordance with the present invention, it can be seen that approximation in a low range with approximately k=1 to 1.5 suffices. The Fourier components $j(k)_s$ are given by:

$$j(k)_s = -j(k) \frac{\underset{r_p \to r_b}{G(k)}}{\underset{r_s \to r_b}{G(k)}} = -\frac{I}{D^s} \qquad \text{Eq. (26)}$$

$$\sum_{n=1}^{Ns} \frac{2i}{k} \{-\cos(k(d_n^s - w_n^s/2)) + \cos(k(d_n^s + w_n^s/2))\} + \text{error}(k)$$

where $D^s$ is the pitch of the turns of each outer coil, $d_n^s$ gives the positions of the upper and lower coils, $w_n^s$ is the width that each tightly wound coil spans, and $N_s$ is the number of the tightly wound coils. In this example of design, $N_s=4$. Optimization is performed with numerical calculations to minimize error(k) in a low range of k. Calculations show that the optimum values are:

$d_1^s=0.41$  $w_1^s=0.13$
$d_2^s=0.41$  $w_2^s=0.20$
$d_3^s=1.12$  $w_3^s=0.26$
$d_4^s=1.73$  $w_4^s=0.066$

Figure 9:
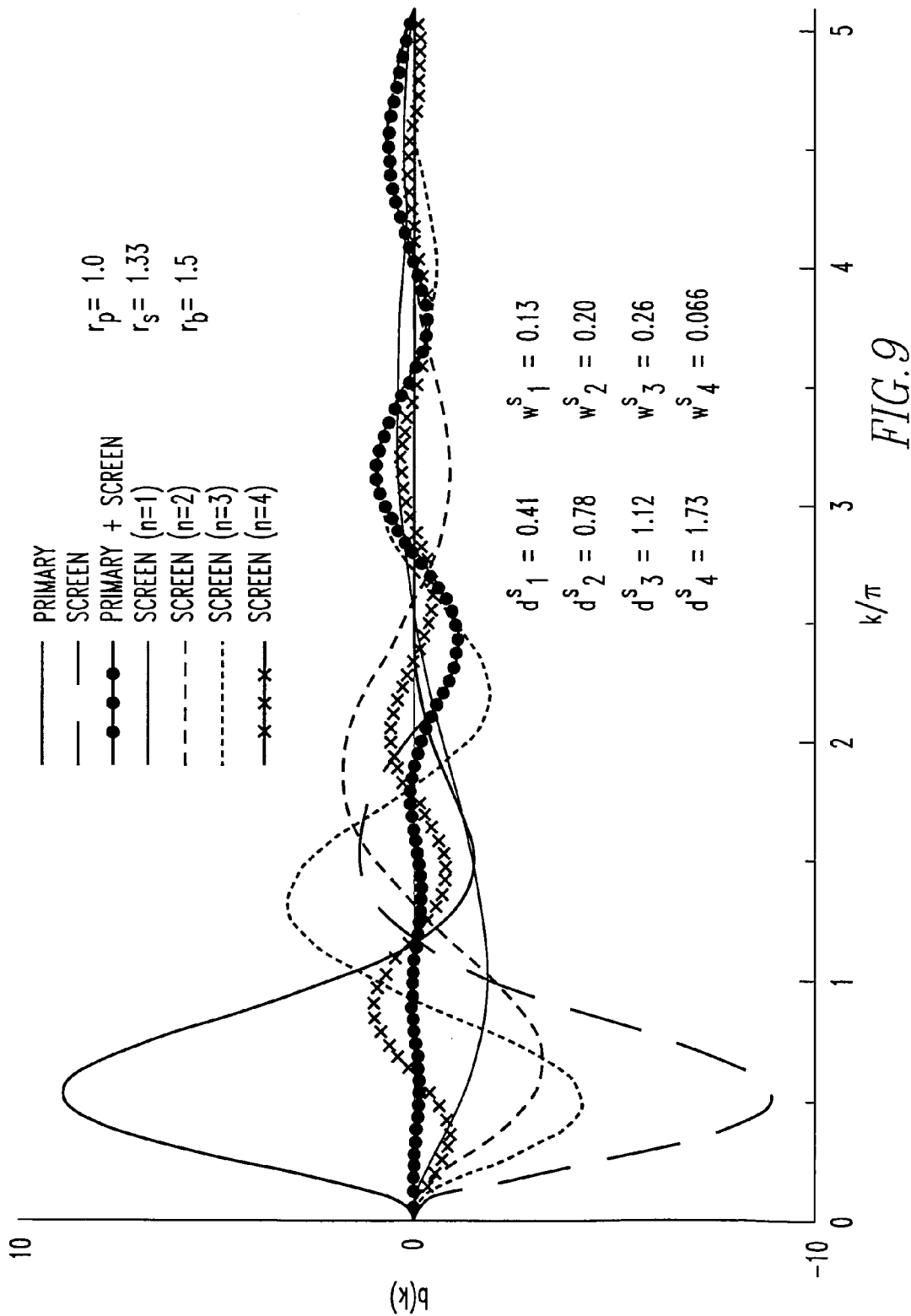
FIG. 9 is a graph showing Fourier components of magnetic fields at a boundary in an example of design.

FIG. 9 is a diagram illustrating the Fourier components of magnetic fields on the boundary in the example of design. The magnetic fields are developed respectively by a primary (inner) coil, a screen (outer) coil, a combination of the primary coil and the screen coil, and the screen coils (n=1, 2, 3, and 4, respectively). The Fourier components of the magnetic fields produced by the inner and outer coils are given by Eqs. (27) and (28), respectively.

$$b(k)_{primary} = j(k)_p \underset{r_p \to r_b}{G(k)} \qquad \text{Eq. (27)}$$

$$b(k)_{screen} = j(k)_s \underset{r_s \to r_b}{G(k)} \qquad \text{Eq. (28)}$$

Using a Green's function, magnetic fields leaking from the inner and outer coil subassemblies are calculated. Also, magnetic field distortions caused by eddy currents produced by the leaking fields are calculated (step S18).

It is assumed that the inner wall of the probe through which eddy current flows has an ideal radius $r_{b1}$. The condition that generation of eddy current prevents magnetic field from leaking outside the probe is replaced by an ideal coil. Then, calculations are performed. The Fourier components of the current at the radius $r_{b1}$ are given by Eq. (29). The magnetic field at the radius $r_t$ is given by Eq. (30).

$$j(k)_{b1} \underset{r_{b1} \to r_{b2}}{} = - \begin{bmatrix} \frac{1}{D^p} \sum_{n=1}^{N_p} \frac{2i}{k} \{-\cos(k(d_n^p - w_n^p/2)) + \cos(k(d_n^p + w_n^p/2))\} \\ G(k) \underset{r_p \to r_{b2}}{} - \frac{1}{D^s} \sum_{n=1}^{N_s} \frac{2i}{k} \{ \dots \} G(k) \underset{r_p \to r_{b2}}{} \end{bmatrix} \frac{1}{G(k) \underset{r_{b1} \to r_{b2}}{}}$$

Eq. (29)

$$B(z) \underset{b_1, r=r_t}{} = \frac{\mu}{2\pi} \int_{-\infty}^{+\infty} e^{ikz} j(k)_{b1} G(k) \underset{r_{b1} \to r_t}{} dk\, dk$$

Eq. (30)

By performing this inverse Fourier transformation, magnetic field distortion due to eddy current is obtained (steps S19 and S20).

If the magnetic field distortion is minimum or within a tolerable range, then the designing is ended. If it is not within the tolerable range, the number of the tightly wound outer coils or the number of turns of each outer coil is reset, and then the step S16 and the subsequent steps are repeated.

In the example of designing described above, the number of the tightly wound inner coils is two. Of course, the invention is not limited to this structure. The linearity can be improved by fabricating the inner coil subassembly from plural pairs of coils. Furthermore, the number of the outer coils may be so modified that the magnetic field distortion falls within the tolerable range. In addition, the theory of the invention can also be applied to designing of X- and Y-axis magnetic field gradient coils, such as saddle coils, as well as Z-axis magnetic field gradient coils. Fingerprint coils designed conventionally can be approximated by plural saddle coils. Furthermore, in the above-described prior art design, the coil assembly consists of a double coil made up of an inner coil subassembly and an outer coil subassembly. The coil assembly may be made of a triple coil or more complex coil structure.

As described thus far, in the present invention, calculation of approximation of an electric current is performed using Fourier components. Therefore, a self-shielding coil of simple structure can be designed. Since the approximation accuracy is high, a coil having a large inside diameter and a simple structure can be easily designed. Furthermore, a small-sized coil can be designed.

Additionally, a realistic coil geometry is established as an initial model and calculated. Consequently, the finally obtained coil geometry can be easily accomplished.

Moreover, individual coils of the inner and outer coil subassemblies are separately calculated. Therefore, a large number of degrees of freedom are given in designing the geometry of each coil. Since the conditions are so set that the magnetic field distortion due to eddy currents becomes null, a coil assembly having good response can be designed.

Further, in the present invention, electric currents are supplied to the inner and outer coils simultaneously as in the conventional designing method to set up magnetic fields. The outer coils do not completely shield the magnetic field. Therefore, eddy currents are produced on the detector cover. However, the eddy currents cancel out the magnetic fields. Also, the amount of magnetic field distortion is small. In addition, the magnetic field energy is small. Consequently, the eddy currents decay quickly and hence magnetic field response similar to the response obtained by the conventional design can be obtained. Therefore, the novel design can be used for high-resolution NMR measurements. Moreover, the inside diameter of the magnetic field gradient coil assembly can be set large. The inside diameter of the inner coil subassembly can be set greater than 70% of the inside diameter of the cover. Since interference with the detection coil does not occur, the sensitivity is prevented from deteriorating. In addition, a heat-insulating tube or an RF shield can be mounted inside without impairing the sensitivity.

Having thus described my invention with the detail and particularity required by the Patent Laws, what is desired protected by Letters Patent is set forth in the following claims.

What is claimed is:

1. A method of designing a magnetic field gradient coil assembly using wound inner and outer coils, said method comprising the steps of:
    setting or resetting the number of said inner coils and optimizing their positions such that a resulting magnetic field strength falls within a tolerable range of a target magnetic field gradient under shielded conditions;
    setting or resetting the number of said outer coils and the number of turns of each outer coil;
    calculating Fourier components of an electric current spatial distribution necessary for the outer coils;
    optimizing positions of the outer coils to approximate the Fourier components of the current distribution;
    calculating magnetic fields leaking from the inner and outer coils, respectively;
    calculating magnetic field distortions caused by eddy currents at the outside of said outer coil produced by the leaking magnetic fields; and
    resetting the number of the outer coils and the number of turns of each outer coil such that the magnetic field distortions caused by eddy currents fall within a tolerable range.

2. A method of designing a magnetic field gradient coil assembly as set forth in claim 1, wherein said step of setting or resetting the number of said inner coils and optimizing their positions such that a resulting magnetic field strength falls within a tolerable range of a target magnetic field gradient under shielded conditions uses a Green's function.

3. A method of designing a magnetic field gradient coil assembly as set forth in claim 1, wherein said step of calculating Fourier components of an electric current distribution necessary for the outer coils uses a Green's function.

4. A method of designing a magnetic field gradient coil assembly as set forth in claim 1, wherein said step of optimizing the positions of the outer coils to approximate the Fourier components of the current distribution performs the approximation using a small number of tightly wound coils.

5. A method of designing a magnetic field gradient coil assembly as set forth in claim 1, wherein said step of calculating magnetic fields leaking from the inner and outer coils, respectively, and said step of calculating magnetic field distortions caused by eddy currents produced by the leaking magnetic fields use a Green's function.

6. A method of designing a magnetic field gradient coil assembly as set forth in claim 1, wherein said step of resetting the number of the outer coils and the number of turns of each outer coil if the magnetic field distortions are outside the tolerable range, said step of calculating Fourier components of an electric current distribution necessary for the outer coils, said step of optimizing the positions of the outer coils to approximate the Fourier components of the current distribution, said step of calculating magnetic fields leaking from the inner and outer coils, respectively, and said step of calculating magnetic field distortions caused by eddy currents produced by the leaking magnetic fields are repeatedly carried out to determine optimum conditions for the outer coils by trial and error.

7. A magnetic field gradient coil assembly having wound inner and outer coils, said magnetic field gradient coil assembly having been designed by a method comprising the steps of:

setting or resetting the number of said inner coils and the number of turns of each inner coil and optimizing their positions such that a resulting magnetic field strength falls within a tolerable range of a target magnetic field gradient under shielded conditions;

setting the number of said outer coils and the number of turns of each outer coil;

calculating Fourier components of an electric current spatial distribution necessary for the outer coils;

optimizing positions of the outer coils to approximate the Fourier components of the current distribution;

calculating magnetic fields leaking from the inner and outer coils, respectively;

calculating magnetic field distortion caused by eddy currents at the outside of said outer coil produced by leaking magnetic fields; and resetting the number of the outer coils and the number of turns of each outer coil such that the magnetic field distortions caused by eddy currents fall within a tolerable range.

8. The magnetic field gradient coil assembly of claim 7, wherein said step of setting or resetting the number of said inner coils and optimizing their positions such that a resulting magnetic field strength falls within a tolerable range of a target magnetic field gradient under shielded conditions uses a Green's function.

9. The magnetic field gradient coil assembly of claim 7, wherein said step of calculating Fourier components of an electric current distribution necessary for the outer coils uses a Green's function.

10. The magnetic field gradient coil assembly of claim 7, wherein said step of optimizing the positions of the outer coils to approximate the Fourier components of the current distribution performs the approximation using a small number of wound coils.

11. The magnetic field gradient coil assembly of claim 7, wherein said step of calculating magnetic fields leaking from the inner and outer coils, respectively, and said step of calculating magnetic field distortions caused by eddy currents produced by the leaking magnetic fields uses a Green's function.

12. The magnetic field gradient coil assembly of claim 7, wherein said step of resetting the number of the outer coils and the number of turns of each outer coil if the magnetic field distortions are outside the tolerable range, said step of calculating Fourier components of an electric current distribution necessary for the outer coils, said step of optimizing the positions of the outer coils to approximate the Fourier components of the current distribution, said step of calculating magnetic fields leaking from the inner and outer coils, respectively, and said step of calculating magnetic field distortions caused by eddy currents produced by the leaking magnetic fields are repeatedly carried out to determine optimum conditions for the outer coils by trial and error.

* * * * *